US010630068B2

(12) United States Patent
Yuan et al.

(10) Patent No.: US 10,630,068 B2
(45) Date of Patent: Apr. 21, 2020

(54) SYSTEM AND SWITCH ASSEMBLY THEREOF WITH FAULT PROTECTION AND ASSOCIATED METHOD

(71) Applicant: Genera Electric Company, Schenectady, NY (US)

(72) Inventors: Zhihui Yuan, Shanghai (CN); He Xu, Shanghai (CN); Jie Shen, Shanghai (CN); Fan Zhang, Shanghai (CN); Stefan Schroeder, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 266 days.

(21) Appl. No.: 15/474,322

(22) Filed: Mar. 30, 2017

(65) Prior Publication Data
US 2017/0288394 A1     Oct. 5, 2017

(30) Foreign Application Priority Data
Mar. 30, 2016   (CN) .......................... 2016 1 0192484

(51) Int. Cl.
*H02H 7/20*     (2006.01)
*H03K 17/081*   (2006.01)
(Continued)

(52) U.S. Cl.
CPC .......... *H02H 7/205* (2013.01); *H02H 7/1216* (2013.01); *H02H 7/1225* (2013.01);
(Continued)

(58) Field of Classification Search
CPC .... H02H 7/205; H02H 7/1216; H02H 7/1225; H02H 7/1255; H03K 17/08116;
(Continued)

(56) References Cited

U.S. PATENT DOCUMENTS

| 4,721,869 A | 1/1988 | Okado |
| 5,949,273 A | 9/1999 | Mourick et al. |

(Continued)

FOREIGN PATENT DOCUMENTS

| CN | 102754345 A | 10/2012 |
| CN | 103797714 A | 5/2014 |

(Continued)

OTHER PUBLICATIONS

Abbate, C., et al., "Series Connection of High Power IGBT modules for traction applications," European Conference on Power Electronics and Applications, pp. 1-8 (2005).

(Continued)

*Primary Examiner* — Kevin J Comber
(74) *Attorney, Agent, or Firm* — Wood IP LLC (57) ABSTRACT

A system, a switch assembly and an associated method. The system includes a number of switch assemblies, each including a switch module, isolation circuits, a detection unit, and a drive unit. The switch module includes power switch devices connected in parallel. The switch modules are connected in series. The isolation circuits each are connected in series to a gate terminal of at least one corresponding power switch device of the power switch devices. Each isolation circuit includes a capacitor or a controllable switch. The detection unit detects faults in at least one of the power switch devices. The drive unit is coupled to the switch module via the isolation circuits for driving the power switch devices of the corresponding switch module, and when the fault is detected, the drive unit is for turning on the power switch devices parallel connected to the at least one of faulty power switch devices.

20 Claims, 8 Drawing Sheets

(51) Int. Cl.
  *H02H 7/122*   (2006.01)
  *H02H 7/125*   (2006.01)
  *H02M 1/32*   (2007.01)
  *H02H 7/12*   (2006.01)
  *H03K 17/082*   (2006.01)
  *H02M 1/088*   (2006.01)

(52) U.S. Cl.
  CPC .......... *H02H 7/1255* (2013.01); *H02M 1/088* (2013.01); *H02M 1/32* (2013.01); *H03K 17/082* (2013.01); *H03K 17/08116* (2013.01); *H02M 2001/325* (2013.01)

(58) Field of Classification Search
  CPC ...... H03K 17/082; H02M 1/088; H02M 1/32; H02M 2001/325
  USPC ........................................................ 361/91.1
  See application file for complete search history.

(56) References Cited

U.S. PATENT DOCUMENTS

| | | | |
|---|---|---|---|
| 6,301,133 | B1 | 10/2001 | Cuadra et al. |
| 6,836,100 | B2 | 12/2004 | Egan et al. |
| 6,856,045 | B1 | 2/2005 | Beneditz et al. |
| 7,054,174 | B2 | 5/2006 | Wu |
| 7,071,661 | B2 | 7/2006 | Thalheim |
| 8,611,113 | B2 | 12/2013 | Asplund |
| 8,847,664 | B2 | 9/2014 | Chimento et al. |
| 8,848,322 | B2 | 9/2014 | Hafner et al. |
| 8,866,348 | B2 | 10/2014 | Venhaus et al. |
| 9,000,827 | B2 | 4/2015 | Klaka et al. |
| 2009/0296433 | A1 | 12/2009 | Sihler et al. |
| 2012/0230076 | A1 | 9/2012 | Palmer et al. |
| 2012/0292999 | A1 | 11/2012 | Henkel et al. |
| 2013/0176752 | A1 | 7/2013 | Schelenz et al. |
| 2014/0168840 | A1* | 6/2014 | Hafner ................. H03K 17/107 361/86 |
| 2016/0315605 | A1* | 10/2016 | Zhang ................ H03K 17/0828 |

FOREIGN PATENT DOCUMENTS

| | | |
|---|---|---|
| CN | 204230869 U | 3/2015 |
| CN | 106655796 A | 5/2017 |
| EP | 2 330 740 A1 | 6/2011 |
| WO | 2012/175109 A1 | 12/2012 |
| WO | 2013/091326 A1 | 6/2013 |
| WO | 2013/139373 A1 | 9/2013 |
| WO | 2014/083214 A1 | 6/2014 |

OTHER PUBLICATIONS

Bauer, F., et al., "Suitability and Optimization of High-Voltage IGBTs for Series Connection With Active Voltage Clamping," IEEE Transactions on Power Electronics, vol. 20, Issue. 6, pp. 1244-1253 (Nov., 2005).

Benwell, A., et al., "Verification of an IGBT Fusing Switch for Over-current Protection of the SNS HVCM," IEEE International Power Modulator and High Voltage Conference, pp. 509-512 (May 23-27, 2010).

Bruckmann, M., et al., "Series Connection of High Voltage IGBT Modules," IEEE Industry Applications Conference, Thirty-Third IAS Annual Meeting, vol. 2, pp. 1067-1072 (Oct. 12-15, 1998).

Chitta, V., et al., "Series Connection of IGBTs with Active Voltage Balancing," IEEE Industry Applications Conference, Thirty-Second IAS Annual Meeting, vol. 2, pp. 961-967 (Oct. 5-9, 1997).

Gerster, C., et al., "Gate-control strategies for snubberless operation of series connected IGBTs," 27th Annual IEEE Power Electronics Specialists Conference, vol. 2, pp. 1739-1742 (Jun. 23-27, 1996).

Gleissner, M., et al., "First Fault-Resilient High-Power 5-Level Flying Capacitor DC-DC Converter with Ideal Short-On Failure IGBT Modules," International Exhibition and Conference for Power Electronics, pp. 1338-1345 (May 19-21, 2015).

Hong, S., et al., "Series Connection of IGBT's with Active Voltage Balancing," IEEE Transactions on Industry Applications, vol. 35, Issue. 4, pp. 917-923 (Jul.-Aug. 1999).

Lim, T.C., et al., "Active Snubber Energy Recovery Circuit for Series-Connected IGBTs," IEEE Transactions on Power Electronics, vol. 26, Issue. 7, pp. 1879-1889 (Jul. 2011).

Lu, T., et al., "Active Clamping Circuit With Status Feedback for Series-Connected HV-IGBTs," IEEE Transactions on Industry Applications, vol. 50, Issue. 5, pp. 3579-3590 (Sep. Oct. 2014).

Lu, T., et al., "Parameter Design of Voltage Balancing Circuit for Series Connected HV-IGBTs," IEEE 7th International Power Electronics and Motion Control Conference (IPEMC), vol. 2, pp. 1502-1507 (Jun. 2-5, 2012).

Lu, T., et al., "Active Clamping Circuit with Status Feedback for HV-IGBT," 15th International Conference on Electrical Machines and Systems (ICEMS), pp. 1-5 Oct. 21-24 (2012).

Nakatake, H., and Iwata, A., "Series connection of IGBTs used multilevel clamp circuit and turn off timing adjustment circuit," IEEE 34th Annual Power Electronics Specialist Conference, vol. 4, pp. 1910-1915 (Jun. 15-19, 2003).

Nguyen, T.V., et al., "Series connection of IGBT," IEEE Twenty-Fifth Annual Applied Power Electronics Conference and Exposition (APEC), pp. 2238-2244 (Feb. 21-25, 2010).

Okada, N., et al., "Series Connection of Snubberless IGBTs for 6.6 kV Transformerless Converters," Power Conversion Conference, pp. 1686-1691 (Apr. 2-5, 2007).

Piazzesi, A., et al., "Series connection of 3.3 kV IGBTs with active voltage balancing," IEEE 35th Annual Power Electronics Specialists Conference, vol. 2, pp. 893-898 (Jun. 20-25, 2004).

Sasagawa, K., et al., "Voltage-Balancing Method for IGBTs Connected in Series," IEEE Transactions on Industry Applications, vol. 40, Issue. 4, pp. 1025 - 1030 (Jul.-Aug. 2004).

Wang, Y., et al., "An Analysis of High-Power IGBT Switching Under Cascade Active Voltage Control," IEEE Transactions on Industry Applications, vol. 45, Issue. 2, pp. 861-870 (Mar.-Apr. 2009).

Withanage, R., et al., "Series connection of Insulated Gate Bipolar Transistors (IGBTs)," European Conference on Power Electronics and Applications, pp. 1-10 (2005).

Zhou, D., and Braun, D.H., "A Practical Series Connection Technique for Multiple IGBT Devices," IEEE 32nd Annual Power Electronics Specialists Conference, vol. 4, pp. 2151-2155 (2001).

International Search Report and Written Opinion issued in connection with related PCT Application No. PCT/US2016/058562 dated Jan. 12, 2017.

Extended European Search Report and Opinion issued in connection with corresponding EP Application No. dated Aug. 22, 2017.

Office Action for Chinese Patent Application No. 201610192484.3, dated Jan. 25, 2019, 8 pages.

* cited by examiner

SYSTEM AND SWITCH ASSEMBLY THEREOF WITH FAULT PROTECTION AND ASSOCIATED METHOD

BACKGROUND

Embodiments of the invention relate to a system with redundant power switch modules, a switch assembly thereof and an associated method, and more particularly to a system and a switch assembly with fault protection for the redundant power switch modules, and a method for fault protection.

Electronic power switches, such as insulated gate bipolar transistor (IGBT) modules, are widely used in the power electronic field, such as high and intermediate voltage frequency converters, IGBT bridges in a chopper, for their excellent electric control property. For high and intermediate voltage applications, multiple switch modules each including multiple electronic power switches are connected in series to provide a large voltage. In such cases, as the total number of series connected switch modules increases, the system reliability is reduced. For example, when one of the switch modules fails, the rest of the series connected switch modules may see increased voltage stress and thus, may not function properly and/or may also fail subsequently.

It is desirable to provide a system, a switch assembly and a method to address the above-mentioned problem.

BRIEF DESCRIPTION

In accordance with one embodiment disclosed herein, a system is provided. The system includes a number of switch assemblies. The switch assemblies each include a switch module, multiple isolation circuits, a detection unit and a drive unit. The switch module includes a number of power switch devices connected in parallel. The switch modules of the switch assemblies are connected in series. The isolation circuits each are connected in series to a gate terminal of at least one corresponding power switch device of the power switch devices. Each isolation circuit includes a capacitor or a controllable switch. The detection unit is for detecting a fault in at least one of the power switch devices. The drive unit is coupled to the switch module via the isolation circuits for driving the power switch devices of the corresponding switch module, and when the fault is detected, the drive unit is for turning on the power switch devices parallel connected to the at least one of faulty power switch devices.

In accordance with another embodiment disclosed herein, a switch assembly is provided. The switch assembly includes a switch module, a number of isolation circuits, a detection unit and a drive unit. The switch module includes a number of power switch devices connected in parallel. The isolation circuits each are connected in series to a gate terminal of at least one corresponding power switch device of the power switch devices. Each isolation circuit includes a capacitor or a controllable switch. The detection unit is for detecting a fault in at least one of the power switch devices. The drive unit is coupled to the switch module via the isolation circuits for driving the power switch devices, and when the fault is detected, the drive unit for turning on the power switch devices parallel connected to the at least one of faulty power switch devices.

In accordance with another embodiment disclosed herein, a method is provided. The method includes providing a number of switch modules connected in series and each comprising a number of power switch devices connected in parallel; providing a number of isolation circuits each connected in series to a gate terminal of at least one corresponding power switch device of the power switch devices. Each isolation circuit includes a capacitor or a controllable switch. The method further includes receiving a faulty signal when at least one of the power switch device is faulty; and turning on the faulty switch module having the faulty power switch device in response to the faulty signal.

BRIEF DESCRIPTION OF THE DRAWINGS

These and other features and aspects of the present disclosure will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "a" and "an" do not denote a limitation of quantity, but rather denote the presence of at least one of the referenced items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect.

Figure 1:
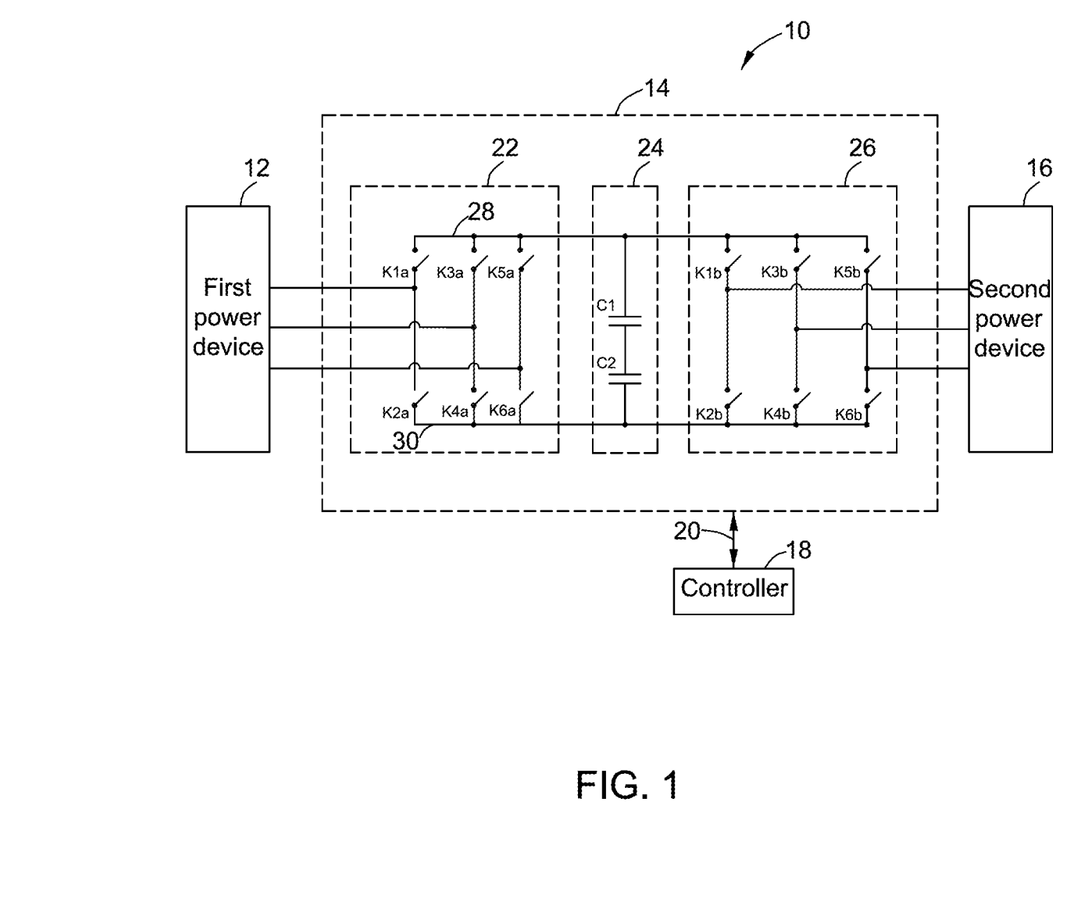
FIG. 1 is a schematic diagram of an apparatus in accordance with an embodiment.

FIG. 1 illustrates a schematic diagram of an apparatus 10 in accordance with an embodiment of the present technique. The apparatus 10 may be used in high and intermediate power applications and high and intermediate voltage applications. For example, the apparatus 10 may be utilized in areas such as, but not limited to, a power plant (e.g., wind power plant), and a natural gas compressor industry, etc., for driving one or more particular loads, such as a pump, a motor, a fan, etc.

As illustrated in FIG. 1, the apparatus 10 includes a first power device 12, a power conversion device 14, a controller 18, and a second power device 16. In an embodiment, the controller 18 is in communication with the power conversion device 14 for transmitting control signals 20 to the power conversion device 14 via one or more electrical links or wires for example. The power conversion device 14 can be operated to perform unidirectional or bidirectional power conversion between the first power device 12 and the second power device 16.

The power conversion device 14 includes a first converter 22 coupled to a second converter 26 via a DC link 24. In an embodiment, the first converter 22 is an AC/DC converter configured to convert AC electric power provided by the first power device 12 (e.g., a power grid) to DC electric power.

In the illustrated embodiment, the first converter 22 includes switch units K1*a*, K2*a*, K3*a*, K4*a*, K5*a*, and K6*a*. The power terminals of the switch units K1*a*, K2*a* are coupled in series between a first DC line 28 and a second DC line 30 to constitute a first phase leg, and a connection point between the switch units K1*a*, K2*a* is coupled to the first power device 12. Similarly, the power terminals of the switch units K3*a*, K4*a* are coupled in series between the first DC line 28 and the second DC line 30 to constitute a second phase leg, and a connection point between the switch units K3*a*, K4*a* is coupled to the first power device 12. Moreover, the power terminals of the switch units K5*a*, K6*a* are coupled in series between the first DC line 28 and the second DC line 30 to constitute a third phase leg, and a connection point between the switch units K5*a*, K6*a* is coupled to the first power device 12. These three connection points of three phase legs form three phase AC input terminals of the first converter 22. In another embodiment, the first converter 22 may be constructed to have a rectifier bridge structure formed by multiple diodes instead of switch units for converting the AC electric power to the DC electric power. It should be noted that this example is merely illustrative and is non-limiting. The number of the switch units K1*a*, K2*a*, K3*a*, K4*a*, K5*a*, and K6*a* in the first converter 22 may be set according to particular applications.

In an embodiment, the DC link 24 may include one or more capacitors configured to filter the DC electric power from the first converter 22, and supply the filtered DC electric power to the second converter 26. In the illustrated embodiment, the DC link 24 includes two capacitors C1, C2 coupled in series between the first DC line 28 and the second DC line 30. It should be noted that this example is merely illustrative and is non-limiting. Number, type and/or capacitance of the capacitors may be set according to particular applications.

In an embodiment, the second converter 26 is a DC/AC converter configured to convert the DC electric power from the DC link 24 into AC electric power and supply the AC electric power to the second power device 16.

As a non-limiting example, the second converter 22 includes switch units K1*b*, K2*b*, K3*b*, K4*b*, K5*b*, and K6*b*. The power terminals of the switch units K1*b*, K2*b* are coupled in series between the first DC line 28 and the second DC line 30 to constitute a first phase leg, and a connection point between the switch units K1*b*, K2*b* is coupled to the second power device 16. The power terminals of the switch units K3*b*, K4*b* are coupled in series between the first DC line 28 and the second DC line 30 to constitute a second phase leg, and a connection point between the switch units K3*b*, K4*b* is coupled to the second power device 16. Further, the power terminals of the switch units K5*b*, K6*b* are coupled in series between the first DC line 28 and the second DC line 30 to constitute a third phase leg, and a connection point between the switch units K5*b*, K6*b* is coupled to the second power device 16. These three connection points of three phase legs form three phase output AC terminals of second converter 26. It should be noted that this example is merely illustrative and is non-limiting. The number of the switch units K1*b*, K2*b*, K3*b*, K4*b*, K5*b*, and K6*b* in the second converter 26 may be set according to particular applications.

In an embodiment, the second power device 16 may include a load, such as, but not limited to, an electric motor used in a natural gas compressing device, a fan, or a pump, which can be driven by the AC electric power from the second converter 26.

Figure 2:
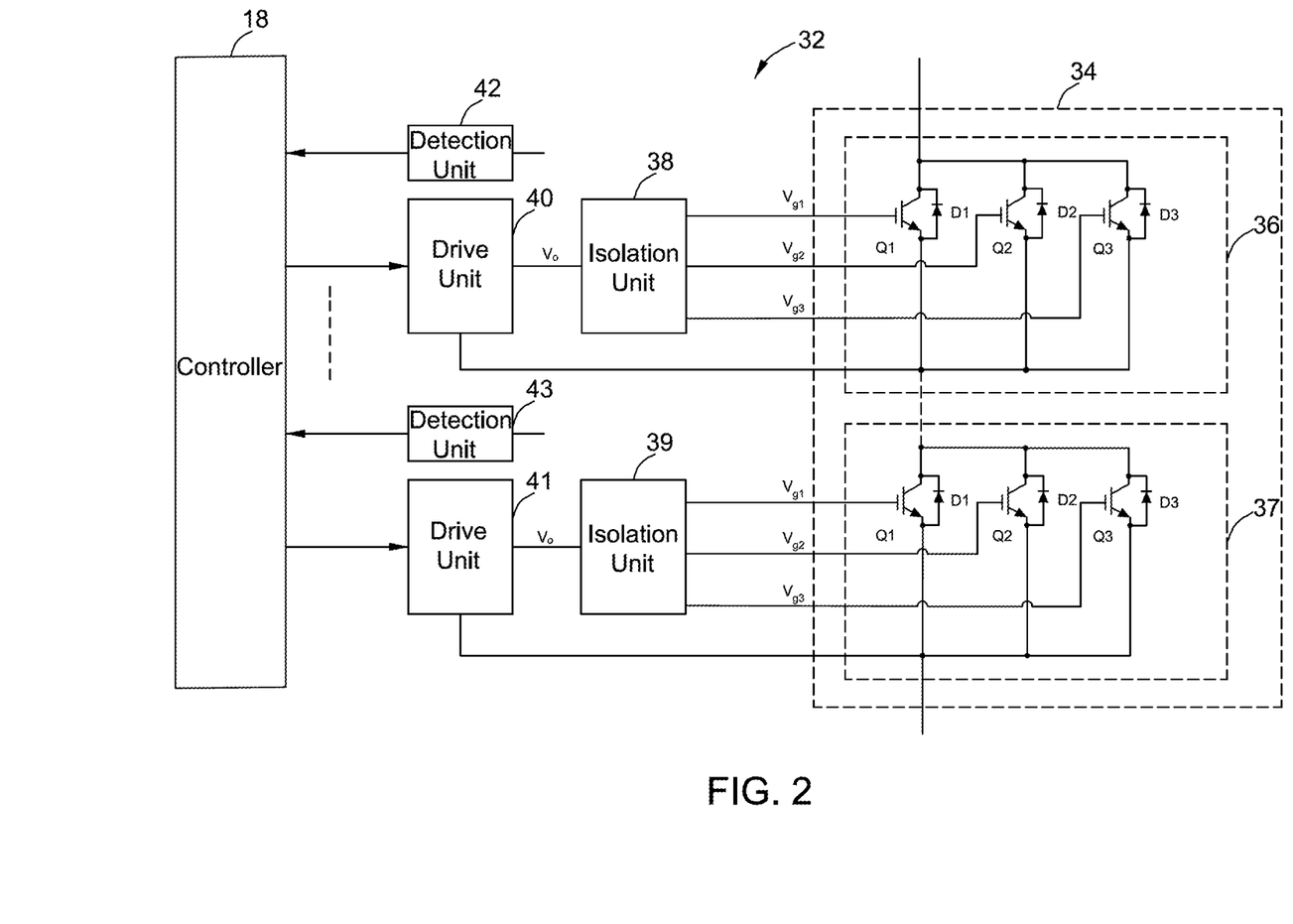
FIG. 2 is a schematic diagram of a system for controlling a switch unit in accordance with an embodiment.

FIG. 2 illustrates a schematic diagram of a system 32 in accordance with an embodiment of the present technique. The system 32 includes a switch unit 34 which may be used in power electronic field, such as, without limitation, high and intermediate voltage frequency converters, switch bridges in a chopper. In an embodiment, the switch unit 34 may be one of the switch units K1*a*, K2*a*, K3*a*, K4*a*, K5*a*, and K6*a* in the first converter 22 or one of the switch units K1*b*, K2*b*, K3*b*, K4*b*, K5*b*, and K6*b* in the second converter 26 in FIG. 1.

The switch unit 34 includes multiple substantially identical high power switch modules 36, 37 connected in series to provide a desired level of switch redundancy. For illustration purpose, only two switch modules 36, 37 are shown in FIG. 2, but the switch unit 34 may include more than two series connected switch modules in particular applications.

In an embodiment, each of the switch modules 36, 37 includes parallel connected power switch devices Q1, Q2, and Q3. Each power switch device Q1, Q2, and Q3 is connected in parallel with a diode D1, D2 or D3. In one embodiment, diodes D1, D2, D3 may be inbuilt in the power switch devices Q1, Q2 and Q3 itself. The power switch devices Q1, Q2, and Q3 can be, without limitation, Insulated Gate Bipolar Transistors (IGBT), Integrated Gate Commutated Thyristor (IGCT), Metal-Oxide-Semiconductor Field Effect Transistors (MOSFET), Injection Enhanced Gate Transistors (IEGT), SiC MOSFET, or any other controllable power switch capable of being controlled between a conducting state and a blocking state. In an embodiment, the power switch devices Q1, Q2, and Q3 are flat-pack IGBTs, and the switch modules 36, 37 may be, without limitation, PrimePACK IGBT modules, EconoPACK IGBT modules, EconoDUAL IGBT modules, or IGBT high-power modules (IHM). For illustration purpose, only three power switch devices Q1, Q2, and Q3 are shown in FIG. 2, but each of the switch modules 36, 37 may include two or more than three parallel connected power switch devices in particular applications.

The system 32 further includes a plurality of isolation units 38, 39, each coupled to the corresponding switch module 36, 37. The isolation units 38, 39 isolate the respective switch modules 36, 37 when the power switch devices Q1, Q2 or Q3 therein are failed to make sure that the remaining healthy switch module are operated normally. Thus, the switch unit 34 continues to conduct full current. For example, if the power switch device Q1 of the switching module 36 fails the isolation unit 38 will isolate the switching module 36 and therefore, the healthy switch module 37 will continue to operate normally. It should be noted that as one of the switch modules 36 or 37 is redundant, even if switch module 36 is isolated during the fault scenario, the switch unit 34 will continue to carry fully current.

The system 32 further includes multiple drive units 40, 41 each coupled to the corresponding switch module 36 or 37 via the corresponding isolation unit 38 or 39 for driving the power switch devices Q1, Q2 and Q3. In one embodiment, the drive units 40, 41 are configured to supply power to the gate drives of the power switch devices Q1, Q2 and Q3 so as to switch on or off the power switch devices Q1, Q2 and Q3 according to a control signal from the controller 18. In another embodiment, the drive units 40, 41 may generate a control signal for the power switch devices Q1, Q2 and Q3 and switch on or off the power switch devices Q1, Q2 and Q3 according to the control signal therein.

The system 32 includes multiple detection units 42, 43 each for detecting a fault in at least one of the power switch devices Q1, Q2 and Q3 of the corresponding switch module 36, 37. In one embodiment, the detection units 42, 43 are configured to detect a voltage supplied to the gate terminals of the power switch devices Q1, Q2 and Q3 to monitor a fault in the switch modules 36, 37. The voltage herein may include, but not limited to, output voltages $V_o$ from the drive units 40, 41, or voltages $V_{g1}$, $V_{g2}$, $V_{g3}$ provided to the power switch devices Q1, Q2 and Q3. In another embodiment, the detection units 42, 43 may be configured to detect one or more other electrical signals, such as, but not limited to, current flowing through the isolation units 38, 39 or current flowing through the power switch devices Q1, Q2, Q3. The detection units 42, 43 are further configured to generate a faulty signal if the fault is detected and provide the faulty signal to the controller 18 in one embodiment, or the corresponding drive unit 40, 41 in another embodiment. The detection units 42, 43 may be multiple individual devices or chips, or integrated in one device or chip.

In the illustrated embodiment, the controller 18 is configured to control the drive units 40, 41 to switch on or off the power switch devices Q1, Q2 and Q3 of switch modules 36, 37 respectively. The controller 18 is further configured to receive the faulty signal from the detection units 42, 43. In response to the received faulty signal, the controller 18 controls the drive unit 40 or 41 in a manner to switch on the power switch devices parallel connected to the faulty power switch devices of the appropriate faulty switch module 36 or 37. In one embodiment, to switch on the appropriate faulty switch module, the controller 18 provides a high pulse signal to the faulty switch module. The controller 18 is further configured to control the remaining drive unit 40 or 41 related to the healthy switch modules 36 or 37 in a normal manner. In other words, the healthy switch 36 or 37 may be turned on or off in accordance with normal voltage and current requirement of the overall system 32. The controller 18 may have any other control function not listed herein.

The controller 18, the detection units 42, 43 and the drive units 40, 41 of the embodiment in FIG. 2 are described herein in terms of functional and/or block components. It should be appreciated that such block components may be realized by any number of hardware, software, and/or firmware components configured to perform the specific functions. Moreover, the system described herein merely illustrates one exemplary embodiment.

Figure 3:
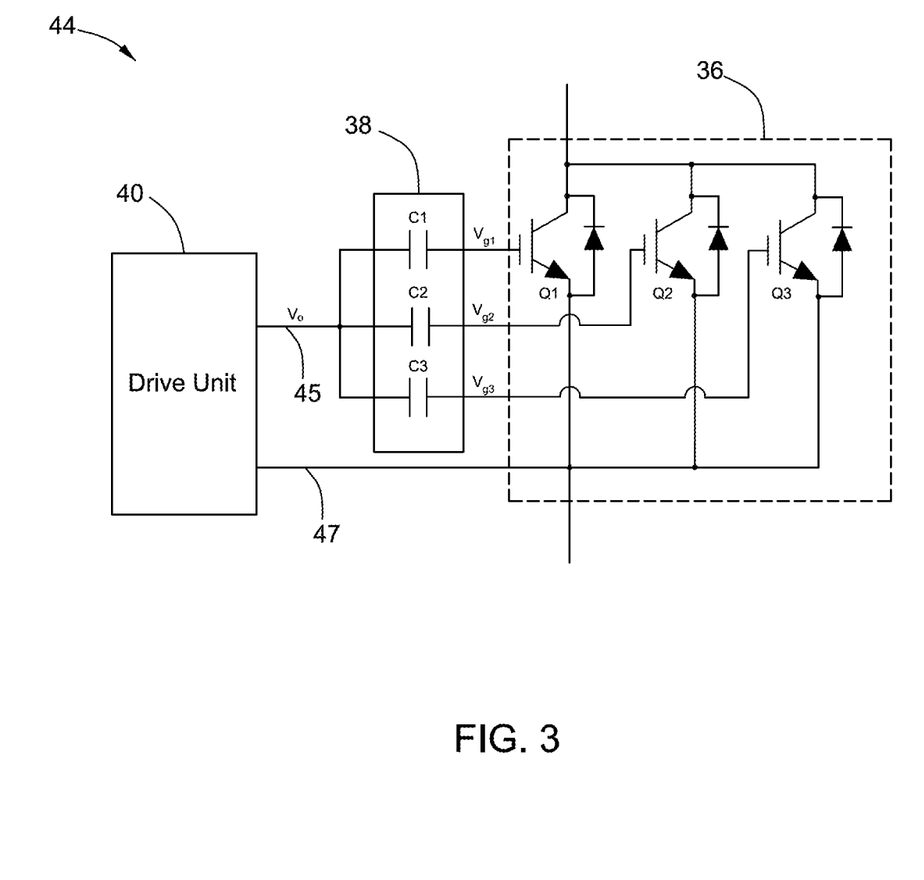
FIG. 3 is a schematic diagram of a switch assembly in accordance with an embodiment.

FIG. 3 illustrates a schematic diagram of a switch assembly 44 in accordance with an embodiment of the present technique. The switch assembly 44 includes the drive unit 40, the isolation unit 38, and the switch module 36 in FIG. 2. The isolation unit 38 includes multiple isolation circuits each connected in series to a gate terminal of the corresponding power switch device Q1, Q2, Q3. In the illustrated embodiment, the isolation circuits each include a capacitor C1, C2, C3. The capacitors C1, C2 and C3 each are connected in series between the gate terminal of the corresponding power switch devices Q1, Q2, Q3 and the drive unit 40. Further, the emitter terminals of the power switch devices Q1, Q2 and Q3 are also connected to the drive unit 40. The gate terminals and the emitter terminals are respectively coupled to two different terminals 45 and 47 of the drive unit 40 to form circuit loops.

The drive unit 40 is configured for driving power switch devices Q1, Q2 and Q3. In other words, the drive unit 40 supplies the power to the gate terminals of the power switch devices Q1, Q2 and Q3 in order to switch on or off the power switch devices Q1, Q2 and Q3. In an embodiment, the drive unit 40 outputs a high voltage, such as, without limitation, 15V, 20 V to switch on the power switch devices Q1, Q2 and Q3, and outputs a low voltage, such as, without limitation, −15V, −7V, to switch off the power switch devices Q1, Q2 and Q3. It is a non-limiting example. The drive unit 40 may be designed to supply expected voltages according to particular power switch devices and switch modules.

In an embodiment, each of the capacitors C1, C2 and C3 has a capacitance larger than an input capacitance (or reference as to stray capacitance) of the corresponding power switch device Q1, Q2 and Q3. In an embodiment, the capacitance of each capacitor C1, C2, C3 is ten times or more than ten times of the input capacitance of the corresponding power switch device Q1, Q2, Q3. Accordingly, there is less influence on normal operation of the power switch devices Q1, Q2 and Q3 resulting from the capacitors C1, C2 and C3.

In an embodiment, the capacitors C1, C2 and C3 may be substantially identical or have different types and/or capacitances. In an embodiment, each of the capacitors C1, C2 and C3 is only one device. In another embodiment, each of the capacitors C1, C2 and C3 is a set of devices which may be, without limitation, connected in series and have a total capacitance larger than the stray capacitance of the corresponding power switch device Q1, Q2 and Q3.

When one power switch device Q1, Q2 or Q3 fails, the drive unit 40 switches on the other non-faulty power switch devices. For the description of operation of the switch assembly 44, it is assumed that during a faulty condition, the power switch device Q1 fails short and the power switch devices Q2 and Q3 are healthy. In one embodiment, a short circuit failure may occur between the gate terminal and the emitter terminal of the power switch device Q1 due to overvoltage therebetween, defect in the power switch device Q1, and/or lifetime of the power switch device Q1. Accordingly, there is a low gate-emitter resistance between the gate terminal and the emitter terminal of the power switch device Q1. In such a situation, the drive unit 40 cannot control the power switch device Q1 to turn on or off.

Figure 4:
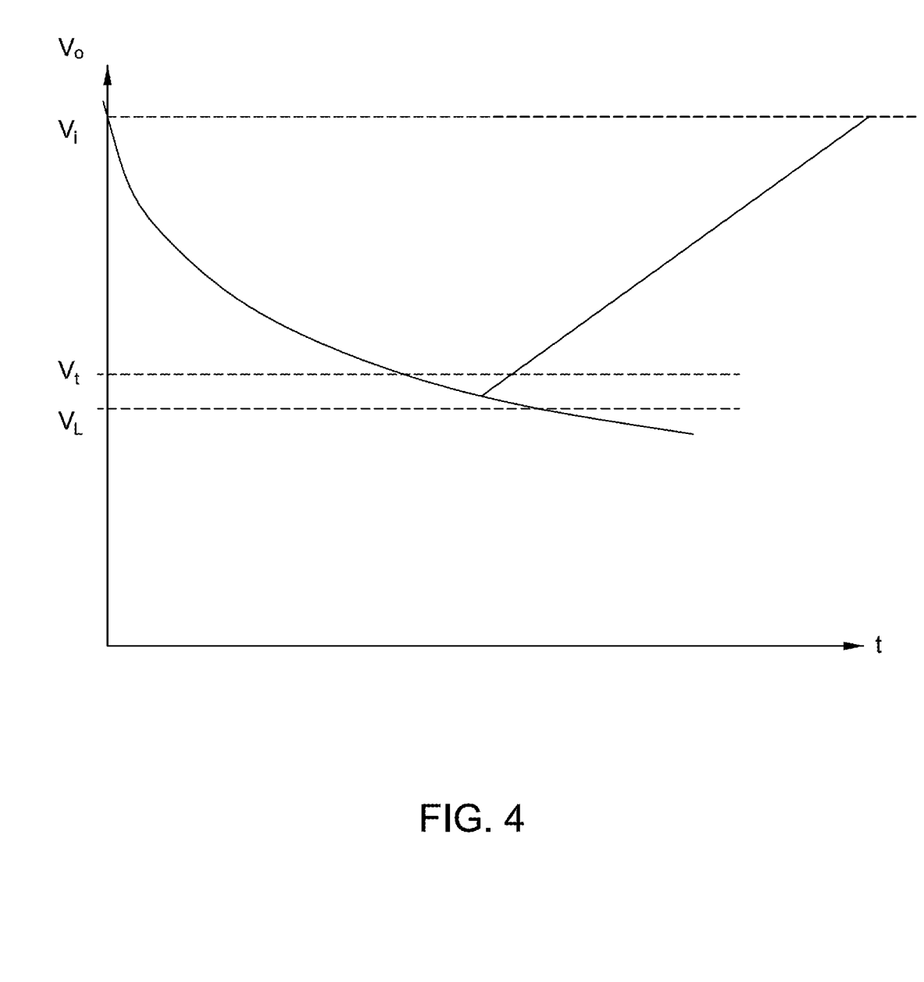
FIG. 4 is a waveform of an output voltage from a drive unit of the switch assembly in accordance with an embodiment.

With reference to FIG. 4, the output voltage $V_o$ from the drive unit 40 decreases from an initial driving voltage $V_i$ due to the faulty power switch device Q1. The initial driving voltage $V_i$ is a voltage for switching on a healthy power switch device in normal condition, which may be 15V for example. The output voltage $V_o$ may be detected by the detection unit 42 in FIG. 2 and the faulty signal is generated by the detection unit 42 when the output voltage $V_o$ is lower than a voltage threshold $V_t$. In one embodiment, the drive unit 40 increases the output voltage $V_o$ in response to the faulty signal, and when the output voltage $V_o$ is higher than the voltage threshold $V_t$, the detection unit 42 stops generating the faulty signal. The output voltage $V_o$ increases to the initial driving voltage $V_i$. In another embodiment, the controller 18 generates a control signal for the drive unit 40 in response to the faulty signal from the detection unit 42, and the drive unit 40 increases the output voltage $V_o$ in response to the control signal from the controller 18. When the output voltage $V_o$ increases, the healthy power switch devices Q2 and Q3 are turned on. Specifically, the drive unit 40 outputs continually the high voltage, and the capacitor C1 is charged by the high voltage and blocks the DC current from the drive unit 40, with the result that the DC current cannot flow to the faulty power switch device Q1, so the faulty power switch device Q1 is bypassed. And the capacitors C2 and C3 are also charged by the high voltage, with the result that the voltages $V_{g2}$ and $V_{g3}$ at the gate terminals of the power switch devices Q2 and Q3 connected respectively to the capacitors C2 and C3 are substantially equal to the output voltage $V_o$, so the healthy power switch devices Q2 and Q3 are switched on. Thus, when a fault on one of the power switch devices of the switch module is detected, the whole switch module is controlled to be short circuited by way of switching on all of the healthy power switch devices in that switch module.

When the fault occurs, the output voltage $V_o$ starts decreasing. However, when drive unit 40 receives the fault signal, drive unit 40 increases the output voltage $V_o$ before it goes below the value of a lowest driving voltage $V_L$ which is a lowest voltage capable of switching on the healthy power switch devices. In one embodiment, the voltage threshold $V_t$ is set higher than the lowest driving voltage $V_L$ to make sure the output voltage $V_o$ does not decrease lower than the lowest driving voltage $V_L$ during a response time from generation of the faulty signal to response from the drive unit 40. In a non-limited example, the output voltage $V_o$ is 15V, the voltage threshold $V_t$ is 13V, and the lowest driving voltage $V_L$ is 12V. However, the output voltage $V_o$, the voltage threshold $V_t$ and the lowest driving voltage $V_L$ may be set according to the properties of the power switch devices in particular applications. Accordingly, the faulty switch module 36 having the faulty power switch device is kept switched on and the rest of the healthy switch modules (e.g., 37) which are series connected with the faulty switch module 36 of the switch unit 34 may be operated normally. In other words, the faulty switch module 36 is bypassed successfully and the switch unit 34 continues to operate normally by carrying the full current.

The switch assembly 44 operates on the same principle as explained above when the power switch device Q2 or Q3 fails instead of power switch device Q1.

Figure 5:
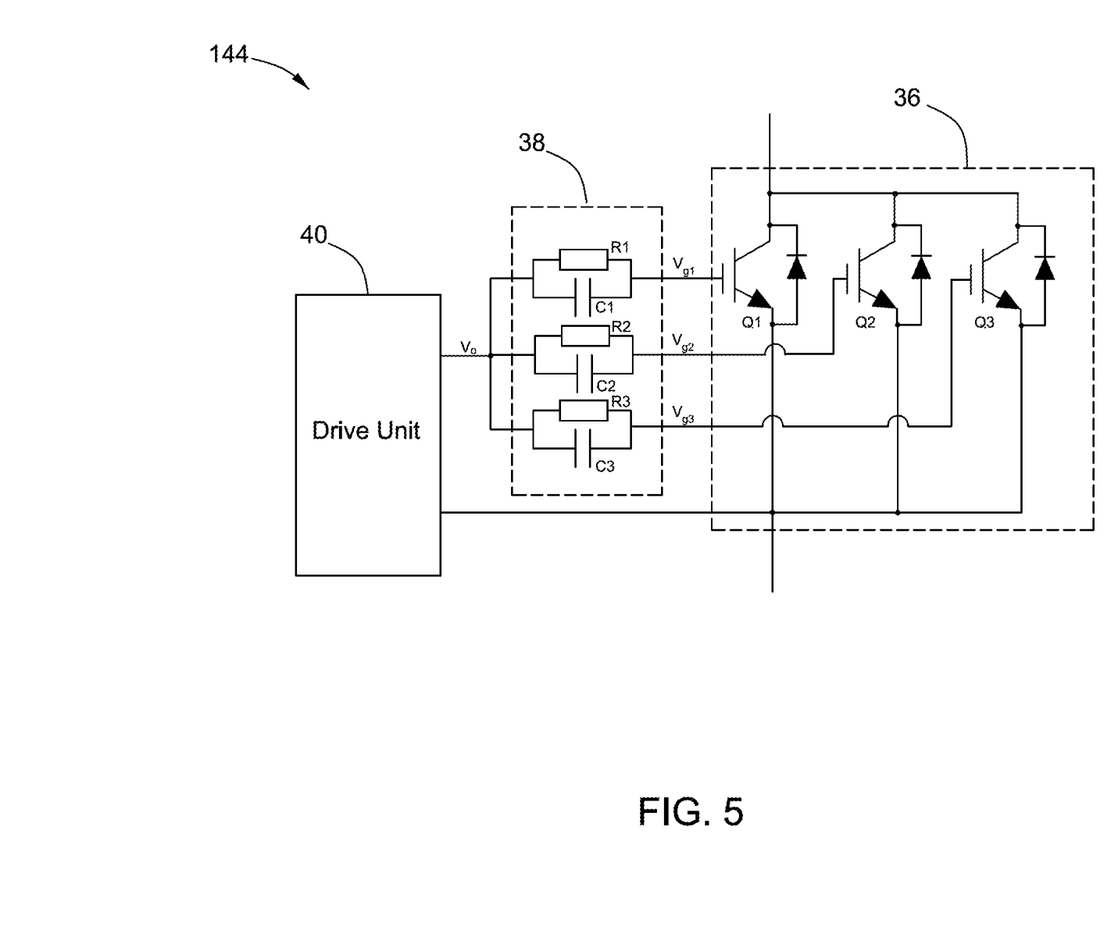
FIG. 5 is a schematic diagram of the switch assembly in accordance with another embodiment.

FIG. 5 illustrates a schematic diagram of the switch assembly 144 in accordance with another embodiment. The switch assembly 144 in FIG. 5 is similar to the switch assembly 44 in FIG. 3. As compared to the switch assembly 44 in FIG. 3, the isolation circuits of the switch assembly 144 in FIG. 5 each include a resistor R1, R2, R3 connected in parallel to the corresponding capacitor C1, C2, C3. During normal operation, the capacitors C1, C2 and C3 in FIG. 3 may have initial bias voltages, which may be low voltages such as, but not limited to, 3V. In the embodiment of FIG. 5, the initial bias voltages on the capacitors C1, C2 and C3 are discharged through the corresponding parallel connected resistors R1, R2 and R3. Thus, the output voltage from the drive unit 40 can be supplied completely to the power switch devices Q1, Q2 and Q3 to make sure that the power switch devices Q1, Q2 and Q3 operate normally.

If any one of the power switch device Q1, Q2, or Q3 is faulty then the output voltage from the drive unit 40 decreases due to the faulty power switch device, the corresponding resistor R1, R2, or R3 and the corresponding capacitor Q1, Q2, or Q3. The operation of the drive unit 40 and the switch module 36 in FIG. 5 is similar to the operation of the drive unit 40 and the switch module 36 in FIG. 3. Specifically, for example, the power switch device Q1 is faulty, the drive unit 40 outputs continually the high voltage in response to the faulty signal. The capacitor C1 is charged by the high voltage and blocks the DC current from the drive unit 40, and the DC current flows through the resistor R1. The resistance of the resistor R1 is large enough to make sure the DC current through the resistor R1 is very small, for example the DC current may be smaller than 1 mA. Thus, the faulty switch device Q1 is bypassed. And the DC current flows through the resistor R2 and R3, the capacitors C2 and C3 are also charged by the high voltage, with the result that the voltages $V_{g2}$ and $V_{g3}$ at the gate terminals of the power switch devices Q2 and Q3 connected respectively to the capacitors C2 and C3 are substantially equal to the output voltage $V_o$, so the healthy power switch devices Q2 and Q3 are switched on. The switch assembly 144 operates on the same principle as explained above when the power switch device Q2 or Q3 fails instead of the power switch device Q1.

The resistance of each resistor R1, R2 or R3 is set also considering required discharge speed of the bias voltages. In an embodiment, each of the resistors R1, R2, R3 may have a resistance not less than 100 ohm ($\Omega$) so as to get a quick discharge of the bias voltages and the DC current through the resistors R1, R2, R3 and the power switch devices Q1, Q2, Q3 is low during the fault.

Figure 6:
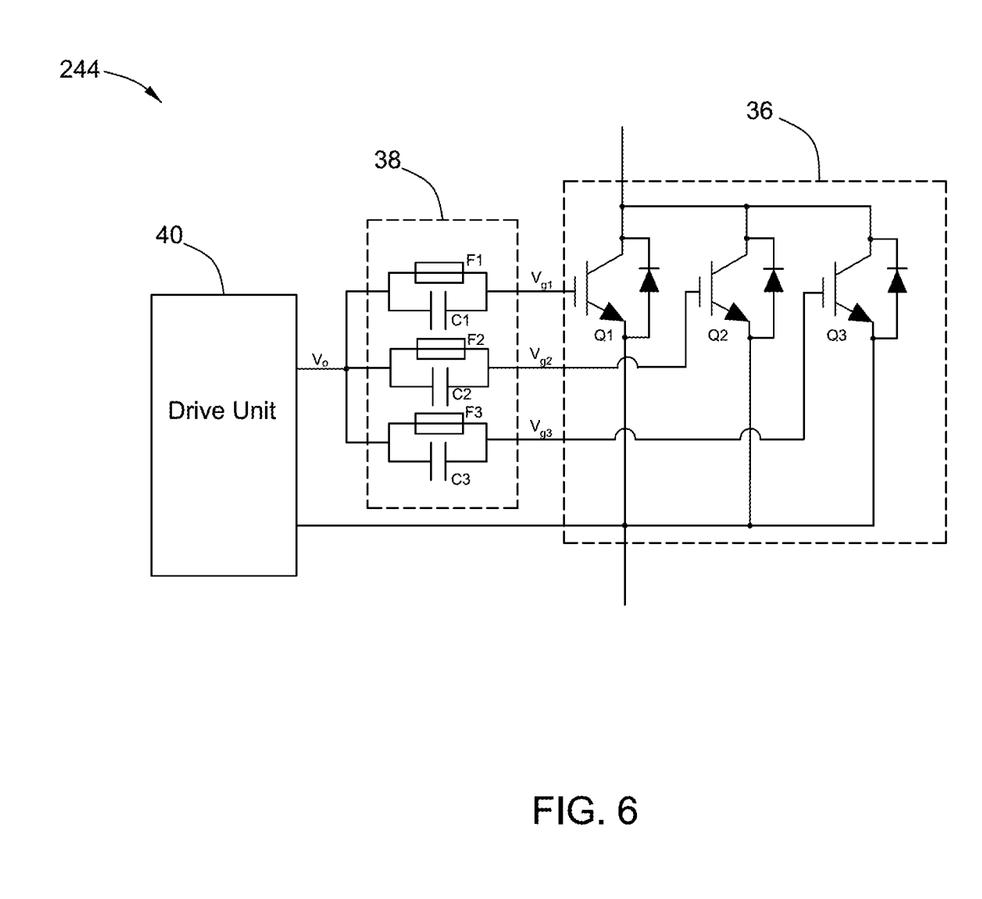
FIG. 6 is a schematic diagram of the switch assembly in accordance with another embodiment.

FIG. 6 illustrates a schematic diagram of the switch assembly 244 in accordance with another embodiment. The switch assembly 244 in FIG. 6 is similar to the switch assembly 44 in FIG. 3. As compared to the switch assembly 44 in FIG. 3, the isolation circuits of the switch assembly 244 in FIG. 6 each include a fuse F1, F2, F3 connected in parallel to the corresponding capacitor C1, C2, C3. The capcacitors C1, C2, C3 in FIG. 3 may have initial bias voltages. In FIG. 6, the initial bias voltages on the capacitors C1, C2 and C3 are discharged through the corresponding parallel connected fuse F1, F2 and F3. The fuses F1, F2 and F3 herein have some resistance which is much smaller than that of the resistors R1, R2, R3 in FIG. 5. In this embodiment, as there is no resistor, the bias voltages can be discharged more quickly through the fuses F1, F2, F3 than the embodiment of FIG. 5.

If one power switch device Q1, Q2, Q3 fails to short, a high current flows through the gate terminal and the emitter terminal thereof, and the series connected fuse F1, F2, F3 is blown down by the current therethrough. The output voltage from the drive unit 40 decreases due to the corresponding capacitor C1, C2, C3 series connected with the faulty power switch device Q1, Q2, Q3. Then the operation of the drive unit 40 and the switch module 36 in FIG. 6 is similar to the operation of the drive unit 40 and the switch module 36 in FIG. 5. Specifically, for example, the power switch device Q1 is faulty and the fuse F1 is blown down. The drive unit 40 outputs continually the high voltage in response to the faulty signal. The capacitor C1 is charged by the high voltage and blocks the DC current from the drive unit 40. Thus, the faulty switch device Q1 is bypassed. And the capacitors C2 and C3 are also charged by the high voltage, with the result that the voltages $V_{g2}$ and $V_{g3}$ at the gate terminals of the power switch devices Q2 and Q3 are substantially equal to the output voltage $V_o$, so the healthy power switch devices Q2 and Q3 are switched on. The switch assembly 244 operates on the same principle as explained above when the power switch device Q2 or Q3 fails instead of the power switch device Q1.

The fuses F1, F2 and F3 are set according to a magnitude of the faulty current that may flow therethrough, the power switch devices Q1, Q2 and Q3, and the output voltage from the drive unit 40. In one embodiment, the fuses F1, F2 and F3 are set so as to make sure the fuses F1, F2 and F3 can be blown down when the fault occurs.

In an alternative embodiment, the isolation circuits each include a positive temperature coefficient (PTC) resistor connected in parallel to the corresponding capacitor C1, C2, C3. The PTC resistors are utilized to replace the fuses F1, F2 and F3, which have similar operating principle with the fuse F1, F2, F3. If one power switch device Q1, Q2, Q3 fails, a high current flows through the gate terminal and the emitter terminal thereof, and the resistance of the corresponding PTC resistor increases rapidly to a considerably high resistance due to the high current therethrough.

Figure 7:
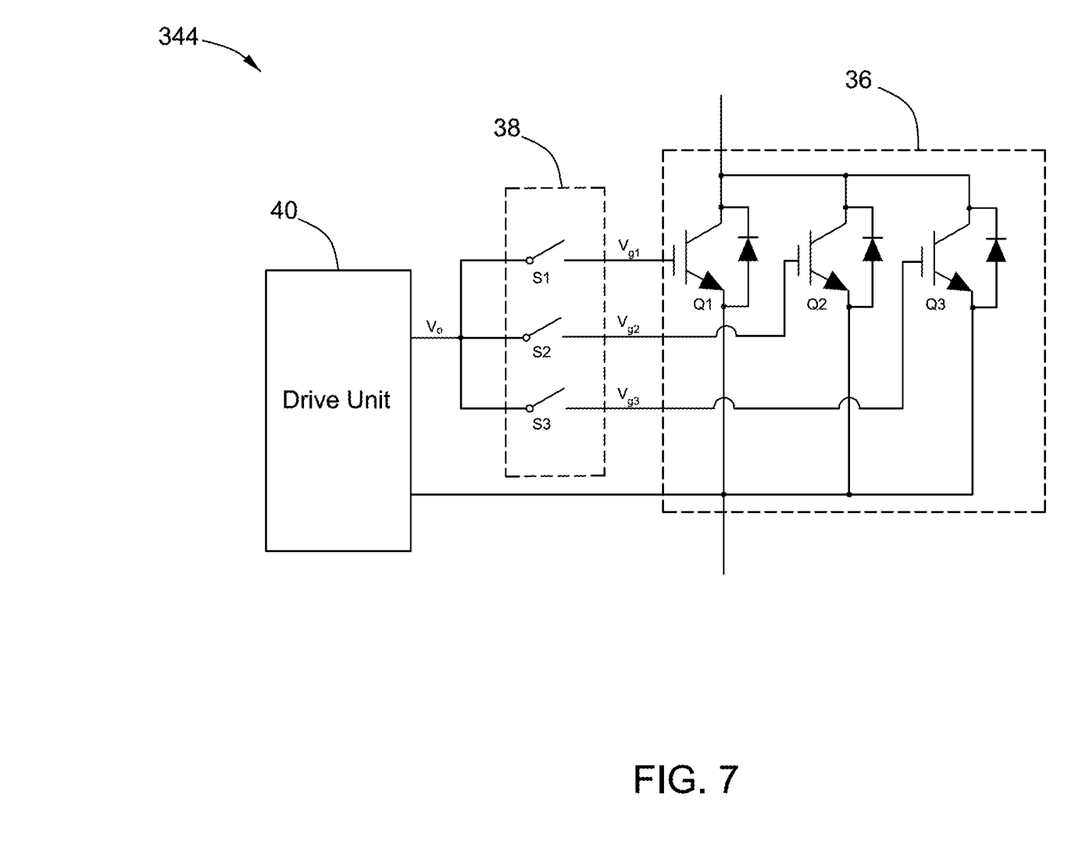
FIG. 7 is a schematic diagram of the switch assembly in accordance with another embodiment.

FIG. 7 illustrates a schematic diagram of the switch assembly 344 in accordance with another embodiment. The isolation circuits each include a controllable switch S1, S2, S3. The controllable switch S1, S2, S3 may be controlled by the drive unit 40 in one embodiment, or controlled by the controller 18 in another embodiment, or controlled by another drive unit or controller in still another embodiment. During normal operation, the controllable switches S1, S2, S3 are kept on. If one power switch device Q1, Q2, Q3 is faulty, the corresponding controllable switches S1, S2, S3 is switched off and the other controllable switches are still on. Further as discussed earlier, during the fault condition, the other healthy power switch devices Q1, Q2, Q3 are switched on by the drive unit 40. The controllable switches S1, S2, S3 may be a transistor, such as, but not limited to, MOSFET, SiC MOSFET, thyristor, or any other switch having function as described herein.

Figure 8:
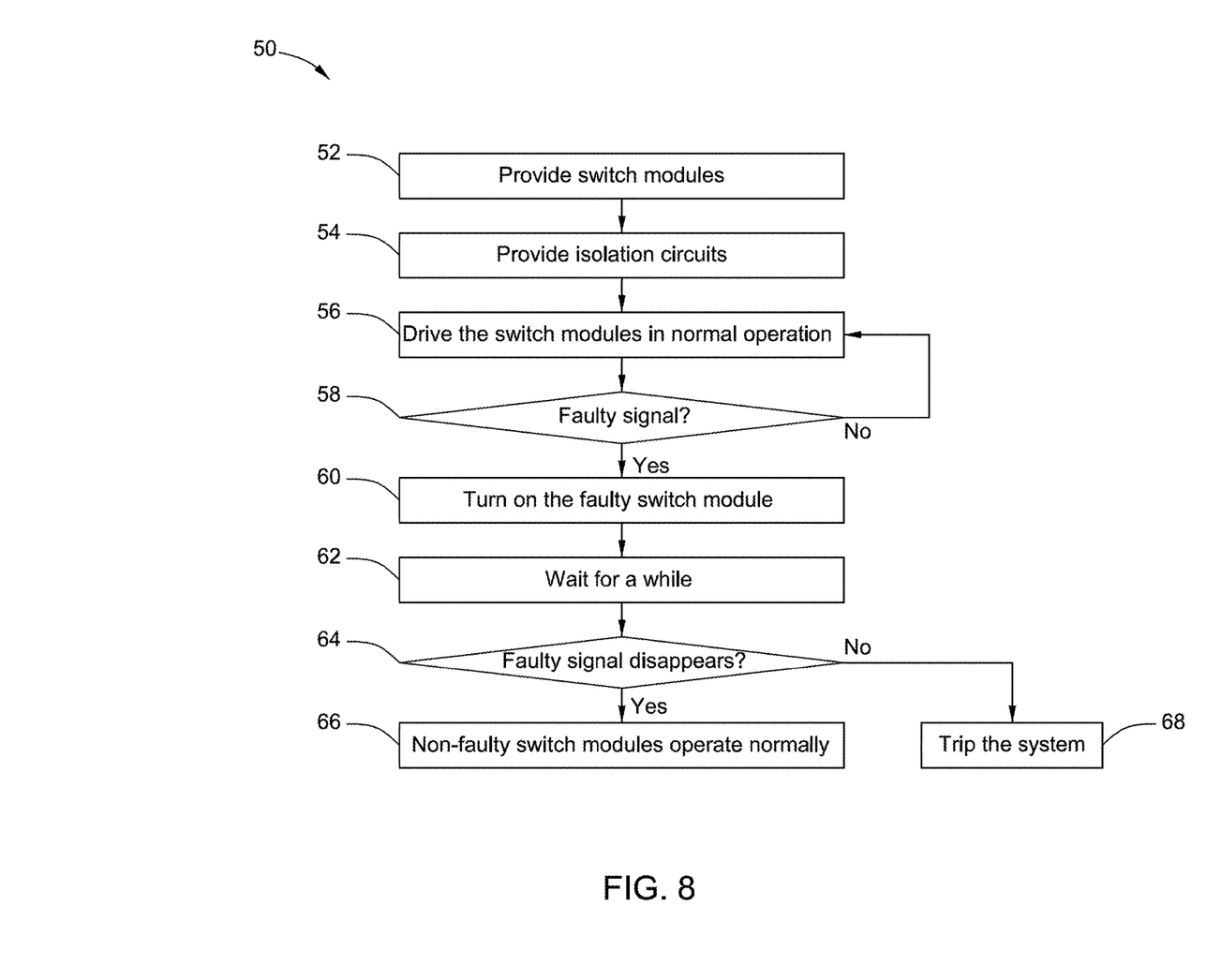
FIG. 8 is a flow chart of a method for fault protection in accordance with an embodiment.

FIG. 8 illustrates a flow chart of a method 50 in accordance with an embodiment of the present technique. In block 52, switch modules connected in series are provided. Each switch module includes multiple power switch devices connected in parallel. The switch modules may be the switch modules 36, 37 in FIGS. 2, 3 and 5-7. In block 54, multiple isolation circuits each connected in series to a gate terminal of at least one corresponding power switch device are provided. Each isolation circuit includes a capacitor or a controllable switch. The isolation circuit may be the isolation circuit of the isolation unit 38, 39 in FIGS. 3, 5-7.

In block 56, the switch modules are driven in normal operation. In other words, the power switch devices of the switch modules are switched on or off at a switching frequency to carry normal load current when the power switch devices are healthy. In block 58, it is determined whether a faulty signal indicating at least one of the power switch device is faulty is received. If all power switch devices are healthy, the faulty signal is not generated and the power switch devices are switched on or off as in normal operation. However, if the power switch is faulty them the faulty signal is generated and received. The switch module having the faulty power switch device is turned on in response to the faulty signal, in block 60.

In block 62, the method includes waiting for a system response time after turning on the faulty switch module to check whether the faulty signal disappears. The response time may have a value such as, but not limited to, 70 ms, 80 ms, 90 ms. In block 64, the method determines whether the faulty signal has disappeared after the system response time. If the faulty switch module is bypassed successfully, the faulty signal disappears. In other words, the faulty power switch device is isolated and the healthy power switch devices of the switch module are switched on. In block 66, if the faulty signal disappears, the all non-faulty switch modules are driven as in normal operation to perform expected function, in block 66. If the faulty signal does not disappear, the system is tripped, in block 68. If the faulty switch module is not bypassed, the faulty signal is still received. The system has to be tripped to stop operation of the system so as to avoid more damage to the system.

While the actions of the methods 50 are illustrated as functional blocks, the order of the blocks and the separation of the actions among the various blocks shown in FIG. 8 are not intended to be limiting. For example, the blocks may be performed in a different order and an action associated with one block may be combined with one or more other blocks or may be sub-divided into a number of blocks.

While embodiments of the invention have been described herein, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

Furthermore, the skilled artisan will recognize the interchangeability of various features from different embodiments. The various features described, as well as other known equivalents for each feature, can be mixed and matched by one of ordinary skill in this art to construct additional systems and techniques in accordance with principles of this disclosure.

The invention claimed is:

1. A system, comprising:
    a plurality of switch assemblies each comprising,
        a switch module comprising a plurality of power switch devices connected in parallel, the switch modules of the plurality of switch assemblies being connected in series;
        a plurality of isolation circuits each connected in series and an output thereof being connected directly to a gate terminal of at least one corresponding power switch device of the plurality of power switch devices, each isolation circuit comprising a capacitor or a controllable switch;
        a detector configured to detect a fault in at least one of the power switch devices; and
        a drive circuit coupled directly to an input of the plurality of isolation circuits and configured to drive the power switch devices of the corresponding switch module, and when the fault is detected, the drive circuit is further configured to turn on the power switch devices parallel connected to the at least one of faulty power switch devices.

2. The system of claim 1, wherein each of the isolation circuits comprises the capacitor connected in series to the gate terminal of the at least one corresponding power switch device.

3. The system of claim 2, wherein the capacitor has a capacitance larger than an input capacitance of the at least one corresponding power switch device.

4. The system of claim 2, wherein the plurality of isolation circuits each comprise a resistor connected in parallel to the capacitor.

5. The system of claim 2, wherein the plurality of isolation circuits each comprise at least one of a fuse and a positive temperature coefficient resistor connected in parallel to the capacitor.

6. The system of claim 1, wherein each of the isolation circuits comprises the controllable switch connected in series to the gate terminal of the at least one corresponding power switch device.

7. The system of claim 6, wherein the controllable switch comprises a transistor.

8. The system of claim 1, wherein the detector is further configured to detect a voltage supplied to the gate terminals of the power switch devices.

9. A switch assembly, comprising:
a switch module comprising a plurality of power switch devices connected in parallel;
a plurality of isolation circuits each connected in series and an output thereof being connected directly to a gate terminal of at least one corresponding power switch device of the plurality of power switch devices, each isolation circuit comprising a capacitor or a controllable switch;
a detector configured to detect a fault in at least one of the power switch devices; and
a drive circuit coupled directly to an input of the plurality of isolation circuits and configured to drive the power switch devices, and when the fault is detected, the drive circuit is further configured to turn on the power switch devices parallel connected to the at least one of faulty power switch devices.

10. The switch assembly of claim 9, wherein each of the isolation circuits comprises the capacitor connected in series to the gate terminal of the at least one corresponding power switch device.

11. The switch assembly of claim 10, wherein the capacitor has a capacitance larger than an input capacitance of the at least one corresponding power switch device.

12. The switch assembly of claim 10, wherein the plurality of isolation circuits each comprise a resistor connected in parallel to the capacitor.

13. The switch assembly of claim 10, wherein the plurality of isolation circuits each comprise at least one of a fuse and a positive temperature coefficient resistor connected in parallel to the capacitor.

14. The switch assembly of claim 9, wherein each of the isolation circuits comprises the controllable switch connected in series to the gate terminal of the at least one corresponding power switch device.

15. The switch assembly of claim 14, wherein the controllable switch comprises a transistor.

16. The switch assembly of claim 9, wherein the detector is for detecting a voltage supplied to the gate terminals of the power switch devices.

17. A method, comprising:
providing a plurality of switch modules connected in series and each comprising a plurality of power switch devices connected in parallel;
providing a plurality of isolation circuits each connected in series and an output thereof being connected directly to a gate terminal of at least one corresponding power switch device of the plurality of power switch devices, each isolation circuit comprising a capacitor or a controllable switch;
receiving a faulty signal when at least one of the power switch device is faulty; and turning, via a driving circuit coupled directly to an input of the plurality of isolation circuits, on the faulty switch module having the faulty power switch device in response to the faulty signal.

18. The method of claim 17, further comprising driving, via the driving circuit, the power switch devices in the other non-faulty switch modules of the plurality of the switch modules on or off if the faulty signal disappears after the faulty switch module is turned on.

19. The method of claim 17, further comprising detecting a voltage supplied to the plurality of the power switch devices and generating the faulty signal if the detected voltage is lower than a voltage threshold.

20. The method of claim 17, wherein the plurality of isolation circuits each comprise at least one of a fuse and a positive temperature coefficient resistor connected in parallel to the capacitor.

* * * * *